United States Patent
Hasan et al.

(10) Patent No.: US 12,334,948 B1
(45) Date of Patent: Jun. 17, 2025

(54) ADAPTIVE ANALOG EQUALIZATION IN ADC-BASED RECEIVER

(71) Applicant: Marvell Asia Pte Ltd, Singapore (SG)

(72) Inventors: Mehedi Hasan, Santa Clara, CA (US); Davide Visani, San Jose, CA (US); Min Wu, San Jose, CA (US); John Farley Ewen, Rochester, MN (US); Ahmed Mostafa, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 61 days.

(21) Appl. No.: 18/165,035

(22) Filed: Feb. 6, 2023

Related U.S. Application Data

(60) Provisional application No. 63/308,480, filed on Feb. 9, 2022.

(51) Int. Cl.
 *H03M 1/18* (2006.01)

(52) U.S. Cl.
 CPC ................................. *H03M 1/18* (2013.01)

(58) Field of Classification Search
 CPC ....................................................... H03M 1/18
 See application file for complete search history.

(56) References Cited

U.S. PATENT DOCUMENTS

| | | | | |
|---|---|---|---|---|
| 6,721,547 B2 * | 4/2004 | Husted | .................. | H04B 1/109 375/345 |
| 7,154,946 B1 * | 12/2006 | Katic | .................... | H04L 7/0058 375/233 |
| 7,646,807 B1 * | 1/2010 | Manickam | ........ | H04L 25/03254 375/348 |
| 7,697,603 B1 * | 4/2010 | Wang | ................ | H04L 25/03057 381/103 |
| 7,924,189 B2 * | 4/2011 | Sayers | .................. | H03M 1/188 341/139 |
| 8,064,509 B1 * | 11/2011 | Cops | .................. | H04L 25/03885 375/232 |
| 8,064,510 B1 * | 11/2011 | Babanezhad | ............ | H04B 3/23 375/232 |
| 9,001,941 B2 * | 4/2015 | Manglani | ............. | H04B 17/318 375/345 |
| 9,426,004 B1 * | 8/2016 | Warner | .................... | H04L 1/205 |
| 10,058,266 B2 * | 8/2018 | Lee | ......................... | A61B 5/053 |
| 11,537,201 B1 * | 12/2022 | Puttaswamy | .......... | H04N 25/46 |
| 2001/0005175 A1 * | 6/2001 | Honma | ................. | H04L 7/0029 341/155 |
| 2004/0189498 A1 * | 9/2004 | Takahashi | ........ | G11B 20/10203 341/138 |
| 2006/0285468 A1 * | 12/2006 | Katsuki | ............ | G11B 20/10055 369/47.26 |
| 2007/0140387 A1 * | 6/2007 | Wong | .................... | H04L 25/061 375/344 |
| 2007/0230640 A1 * | 10/2007 | Bryan | ............... | H04L 25/03878 375/345 |
| 2007/0262895 A1 * | 11/2007 | Stein | .................... | H03M 1/1033 341/155 |

(Continued)

*Primary Examiner* — Lam T Mai

(57) ABSTRACT

An analog-to-digital converter-based serial receiver configured to tune analog equalization settings for link training is described. An analog signal from a transmitter is received and the receiver applies initial analog equalization settings. The receiver then converts the equalized analog signal into a digital signal. The receiver then measures frequency content of the analog signal and saturation at the analog-to-digital converter and determines updated analog equalization settings.

18 Claims, 4 Drawing Sheets

(56) References Cited

U.S. PATENT DOCUMENTS

| | | | |
|---|---|---|---|
| 2009/0279597 A1* | 11/2009 | Bereza | H04L 25/0272 375/232 |
| 2010/0149006 A1* | 6/2010 | Samueli | H04L 12/44 341/118 |
| 2015/0002326 A1* | 1/2015 | Farley | H03M 1/002 327/91 |
| 2021/0152404 A1* | 5/2021 | Levin | H04L 25/03885 |
| 2022/0247603 A1* | 8/2022 | Razavi Majomard | H04B 3/238 |
| 2022/0247652 A1* | 8/2022 | Balasubramonian | H04L 43/16 |
| 2023/0037860 A1* | 2/2023 | Wang | H04L 25/03057 |
| 2023/0354445 A1* | 11/2023 | Lee | H04L 5/1438 |

\* cited by examiner

ADAPTIVE ANALOG EQUALIZATION IN ADC-BASED RECEIVER

CROSS REFERENCE TO RELATED APPLICATION

This disclosure claims the benefit of commonly-assigned U.S. Provisional Patent Application No. 63/308,480, filed Feb. 9, 2022, which is hereby incorporated by reference herein in its entirety.

FIELD OF USE

This disclosure relates to tuning equalization settings for link training. More specifically, this disclosure relates to a method and apparatus for tuning equalization settings for link training of an analog-to-digital-converter-based (ADC-based) serial receiver.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

In a serializer/deserializer (SerDes) system, transmitters and receivers must perform link training by tuning equalization settings and determining the quality of a signal before transmitting and receiving normal data traffic. A receiver in an ADC-based SerDes system typically includes at least an analog front end (AFE), an ADC, digital equalization circuitry, and a slicer. The AFE provides continuous-time linear equalization (CTLE). The digital equalization circuitry may include, for example, feed-forward equalization (FFE) circuitry and decision-feedback equalization (DFE) circuitry. The slicer is used to decide whether a received value is a '0' or a '1'. For example, in many implementations, a pulse below one-half of the maximum voltage level may be considered a '0', while a pulse at or above one-half of the maximum voltage level may be considered a '1'.

In typical systems, a sweep may be performed over the space of analog equalization settings to determine optimal broadband gain, peak gain and DC gain. The quality of the signal may be measured by a figure-of-merit (FoM). Typical measurements used for the FoM in a SerDes system include eye height or eye width. However, producing and measuring a data eye requires an analog signal. In an ADC-based SerDes, the signal has already been converted to a digital signal and therefore neither eye height nor eye width can be used as the FoM. As a result, ADC-based SerDes systems typically determine an FoM by calculating errors at the slicer. For example, a least-mean-square calculation may be performed to determine the minimum mean square error. However, the least-mean-square calculation typically requires a precise clock for sampling. In order to generate a precise clock, CTLE tuning needs to be performed. This creates a paradox wherein determining settings for CTLE requires a clock, but in order to generate a clock, the CTLE tuning needs to be performed.

SUMMARY

This disclosure describes an analog-to-digital converter-based serial receiver configured to tune analog equalization settings. An analog signal from a transmitter is received and the receiver applies initial analog equalization settings to generate an equalized analog signal. An analog-to-digital converter converts the equalized analog signal into a digital signal. The receiver then measures a frequency content of the digital pap signal and a saturation at the analog-to-digital converter. Based on the frequency content and the saturation, the receiver determines updated analog equalization settings.

In some implementations, the frequency content is measured by applying digital equalization settings with high-pass filter coefficients to the digital signal to generate a high-pass-filtered digital signal and measuring an average power of the high-pass filtered digital signal. Then, the receiver applies digital equalization settings with low-pass filter coefficients to the digital signal to generate a low-pass-filtered digital signal and measures an average power of the low-pass filtered digital signal.

In some implementations, the saturation is measured by calculating a percentage of amplitudes of the analog signal which are outside a threshold range of the analog-to-digital converter.

In some implementations, measuring an average power of the high-pass filtered digital signal, measuring an average power of the low-pass filtered digital signal, and measuring the saturation are performed sequentially at a monitor. In some embodiments, measuring an average power of the high-pass filtered digital signal is performed at a first monitor, measuring an average power of the low-pass filtered digital signal is performed at a second monitor, and measuring the first saturation is performed at a third monitor. These measurements are performed at the three monitors in parallel.

In some implementations, a second analog signal from the transmitter is received and the receiver applies the updated analog equalization settings. An analog-to-digital converter converts the second equalized analog signal into a second digital signal. The receiver then measures a frequency content of the second digital signal and a saturation at the analog-to-digital converter. Based on the frequency content and the saturation of the second digital signal, the receiver determines a second set of updated analog equalization settings.

In some implementations, in response to determining the updated analog equalization settings, the receiver increments an update counter. The receiver then compares the update counter to an update threshold. If the receiver determines that the update counter has exceeded an update threshold, the receiver stores the updated analog equalization settings.

In some implementations, determining the updated analog equalization settings comprises applying a least mean squares function.

BRIEF DESCRIPTION OF THE DRAWINGS

Further features of the disclosure, its nature, and various advantages, will be apparent upon consideration of the following detailed description, taken in conjunction with the accompanying drawings, in which like reference characters refer to like parts throughout, and in which.

DETAILED DESCRIPTION

The subject of this disclosure is the tuning of analog equalization settings for link training of an analog-to-digital-converter-based serial receiver. As discussed above, until such equalization has been performed, no precise clock is available, but performing equalization requires a precise clock. Therefore, in accordance with implementations of the subject matter of this disclosure, in order to determine the optimum receiver equalization settings without a precise clock, implementations of the subject matter of this disclosure may use digital filter content and saturation of the ADC dynamic range as figures-of-merit.

Digital filter content may be measured by filtering the digital signal through a digital equalizer. In some implementations, the digital equalizer may be an FFE or a DFE. Digital equalization may be performed on the digital signal using low-pass filter coefficients. A hardware monitor then measures the average power of the digital signal that has been subject to low-pass filtering. Digital equalization may then be performed on the digital signal using high-pass filter coefficients. A hardware monitor then measures the average power of the digital signal that has been subject to high-pass filtering. A properly equalized signal should contain a balance of high and low frequencies. Equalization settings should accomplish the goal of balancing the average power of the digital signal that has been subject to high-pass filtering and the average power of the digital signal that has been subject to low-pass filtering.

Saturation of the ADC is calculated as a percentage of samples of the analog signal whose amplitudes are outside a threshold range. This threshold range of amplitudes is the dynamic range that the ADC is capable of converting. Therefore, equalization settings should be set so that the ADC converts as much as possible of the analog signal that it receives. In some implementations, the saturation settings training method is set to target may be less than the full dynamic range, e.g. 75%, of [the maximum voltage swing] so that the bulk of the signal may be received without outliers. In some implementations, the threshold may be a preset value that is set according to the speed at which data is transferred.

In some implementations, the equalization settings may be determined by microcontroller-based firmware (MCU). In some implementations, the equalization settings training method may use a least-mean-squares technique to determine the optimal equalization settings. However, the received signals may be too fast to be measured by the microcontroller or other firmware. Therefore, in some implementations, the digital frequency content and saturation are measured by hardware monitors, and those measurements may be used in the equalization settings training method.

Figure 1:
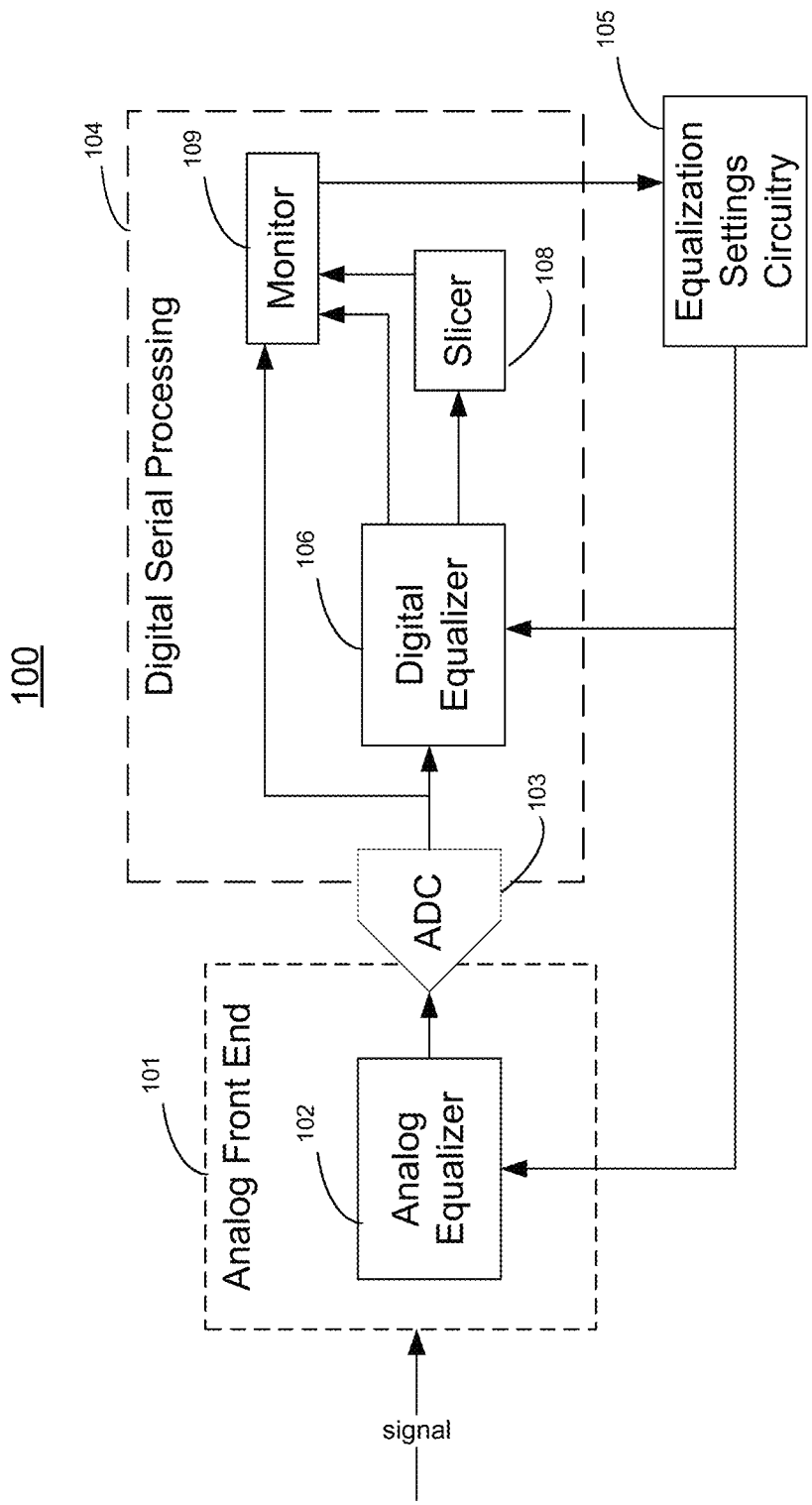
FIG. 1 is an illustration of a receiver configured to determine equalization settings for link training in an ADC-based SerDes system, according to implementations of the subject matter of this disclosure with one monitor.

FIG. 1 is an illustration of a receiver configured to determine equalization settings for link training in an ADC-based SerDes system with one monitor by measuring the frequency content and saturation at that monitor serially.

The digital signal is sent from ADC 103 to monitor 109 which measures the saturation of the ADC. The digital signal is also sent from ADC 103 to digital equalizer 106. In some implementations, digital equalizer 106 may be implemented as an FFE or a DFE. Digital equalizer 106 filters the digital signal into a digital signal that has been subject to high-pass filtering and a digital signal that has been subject to low-pass filtering. The filtered signals are sent to slicer 108 and monitor 109. Monitor 109 measures the frequency content of the filtered signals by measuring the average power of each.

Monitor 109 measures, seriatim, the saturation, the frequency content of the digital signal that has been subject to low-pass filtering, and the frequency content of the digital signal that has been subject to high-pass filtering. All three measurements are passed to equalization settings circuitry 105. In some implementations, digital equalization circuitry may be implemented by an MCU. Digital equalization circuitry 105 updates analog equalizer 102 with settings based on the frequency content and saturation. In implementations where analog equalizer 103 implements CTLE, equalization settings circuitry 105 updates the CTLE settings to increase or decrease broadband gain, peak gain, and DC gain.

In some implementations, equalization settings circuitry 105 may increment an update counter which it increments each time the digital serial process is implemented. Equalization settings circuitry 105 may then transmit updated settings to digital equalizer 107 and perform the digital serial processing again. In some implementations, if the update counter has exceeded a threshold, equalization settings circuitry 105 may store the settings for that pass and terminate the process. Receiver 100 may then notify the transmitter that the link training process is complete, and it is prepared for regular data traffic.

Figure 2:
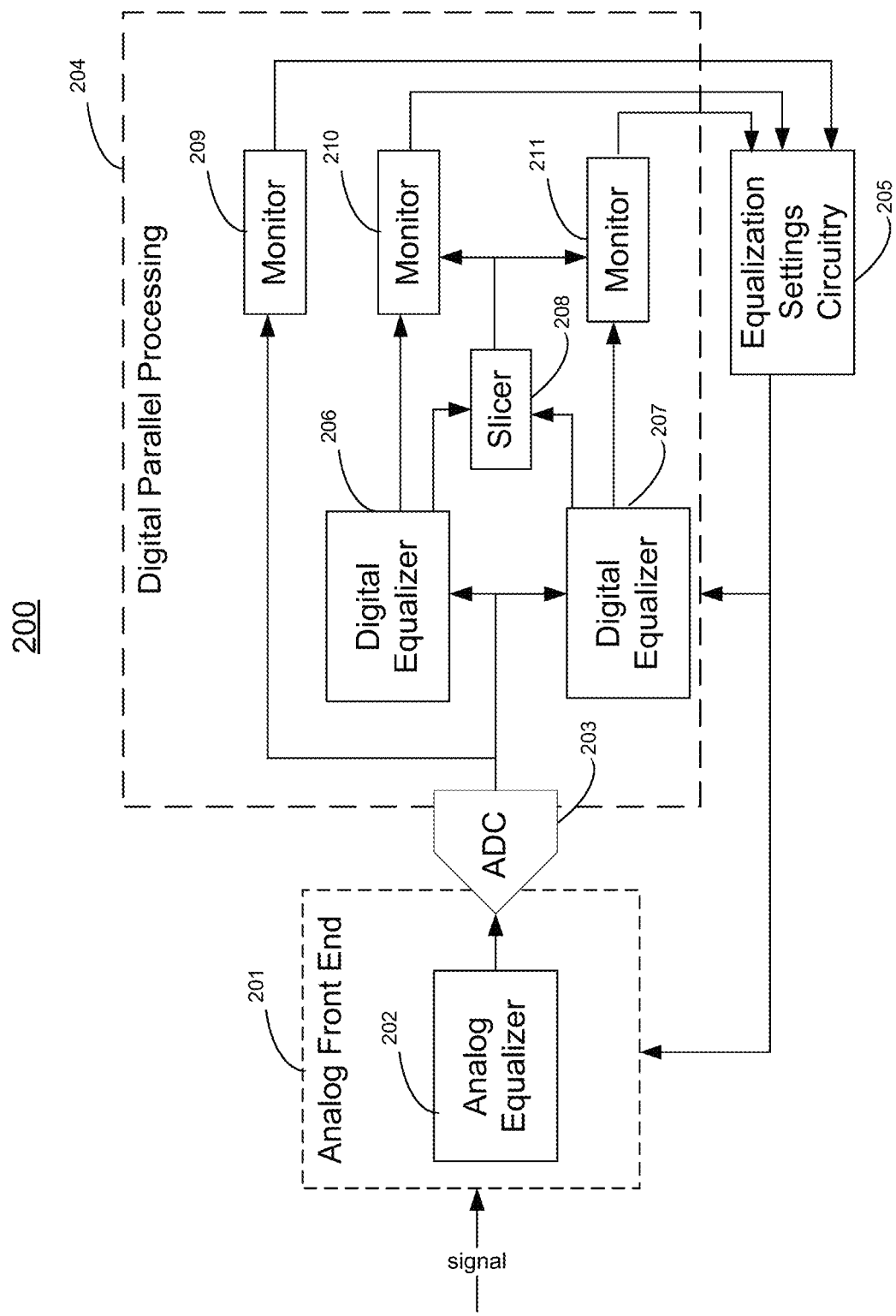
FIG. 2 is an illustration of a receiver configured to determine equalization settings for link training in an ADC-based SerDes system, according to implementations of the subject matter of this disclosure with three monitors.

FIG. 2 is an illustration of a receiver configured to determine equalization settings for link training in an ADC-based SerDes system with three monitors configured to measure the frequency content and saturation at the same time. The analog signal is received at the analog front end 201 where it is equalized by analog equalizer 202. In some implementations, analog equalizer 202 may implement CTLE. The equalized analog signal is then converted to a digital signal at ADC 203. ADC 203 passes the signal to digital parallel processing circuitry 204.

The digital signal is sent from ADC 203 to monitor 209 which measures the saturation of the ADC dynamic range. The digital signal is also sent from ADC 203 to digital equalizer 206 and digital equalizer 207. In some implementations, digital equalizer 206 and digital equalizer 207 may be implemented as an FFE or a DFE. Digital equalizer 206 applies low-pass filtering to the digital signal, and digital equalizer 207 applies high-pass filtering to the digital signal. Slicer 208 makes decisions on the values of the filtered signals. The equalized output of digital equalizer 206 and the corresponding decisions from slicer 208 are input to monitor 210 which measures the frequency content of the signal that has been subject to low-pass filtering, by measuring the average power. The equalized output of digital equalizer 207 and the corresponding decisions from slicer 208 are input to monitor 211 which measures the frequency content of the signal that has been subject to high-pass filtering, by measuring the average power.

Monitors 209, 210, and 210 measure the saturation, the frequency content of the digital signal that has been subject to low-pass filtering, and the frequency content of the digital signal that has been subject to high-pass filtering, respectively, in parallel. All three measurements are passed to equalization settings circuitry 205. In some implementations, equalization settings circuitry 205 may be implemented by an MCU. Equalization settings circuitry 205 updates analog equalizer 202 with settings based on the frequency content and saturation. In implementations where analog equalizer 203 implements CTLE, equalization settings circuitry 205 updates the CTLE settings to increase or decrease broadband gain, peak gain, and DC gain.

In some implementations, equalization settings circuitry 205 may increment an update counter which it increments each time the digital serial process is implemented. Equalization settings circuitry 205 may then transmit updated settings to digital equalizer 207 and perform the digital parallel processing in another pass. In some implementations, if the update counter has exceeded a threshold, equalization settings circuitry 205 may store the settings for that pass and terminate the process. Receiver 200 may then notify the transmitter that the link training process is complete, and it is prepared for regular data traffic.

Figure 3:
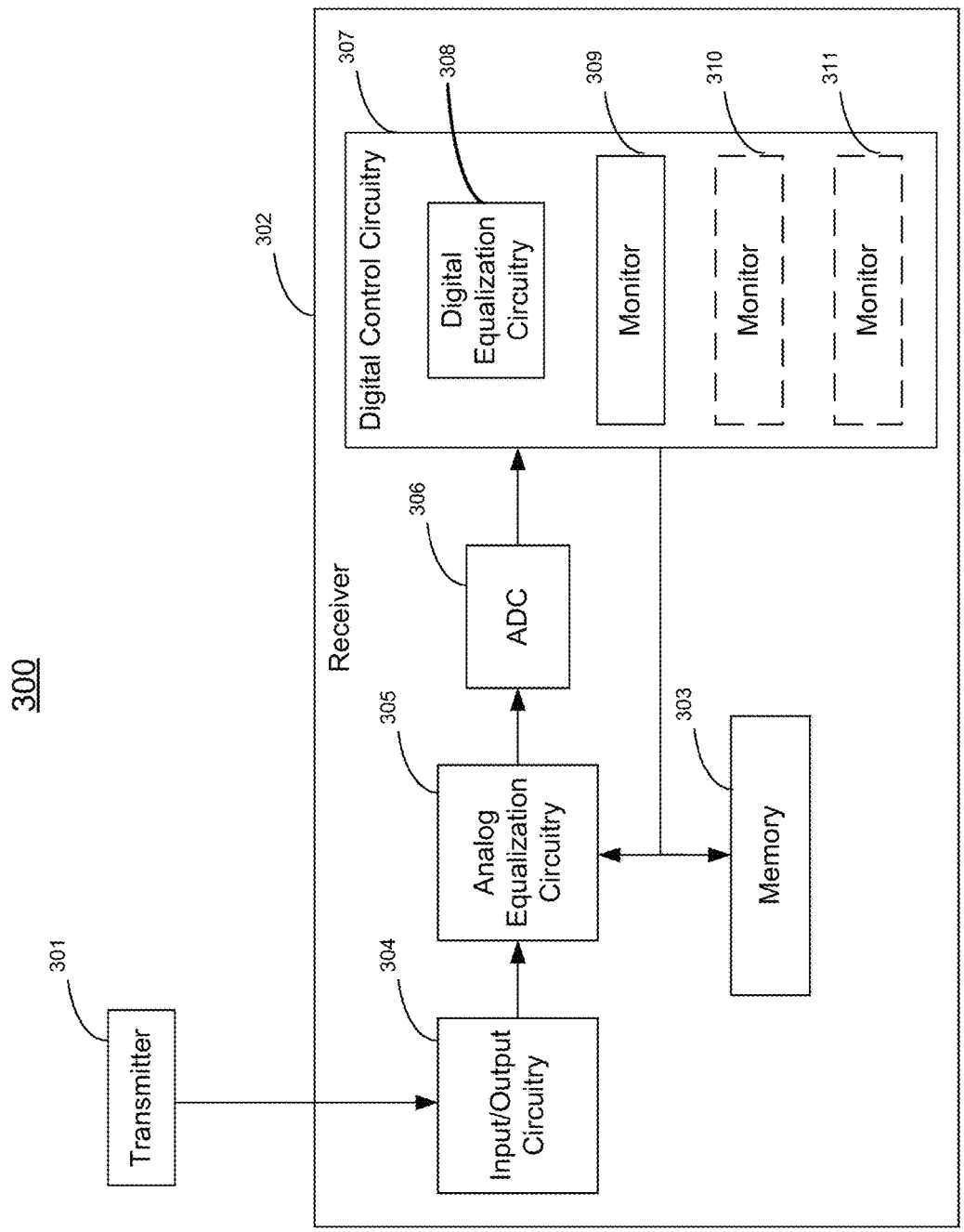
FIG. 3 is a block diagram illustrating components of a network node that is configured to perform a method for determining equalization settings for link training in an ADC-based SerDes system according to implementations of the subject matter of this disclosure.

FIG. 3 is a block diagram illustrating components of a network node that is configured to implement a method for determining equalization settings for link training in an ADC-based SerDes system according to implementations of the subject matter of this disclosure. Transmitter 301 transmits an analog signal to receiver 302, which receiver 302 receives at input/output circuitry 304. Input/output circuitry transmits the analog signal to analog equalization circuitry 305. Analog equalization circuitry 305 may be configured to implement CTLE. ADC 306 then converts the analog signal to a digital signal and transmits it to digital control circuitry 307.

Digital control circuitry 307 is configured to implement the digital equalization and training process in accordance with this disclosure. In some implementations, digital equalization circuitry 308 may be an FFE or a DFE Digital equalization circuitry 308 may comprise one digital equalization circuitry, in accordance with serial processing 104 in FIG. 1, or two digital equalization circuitries, in accordance with parallel processing 204 in FIG. 2. Digital control circuitry 207 also contains monitors for measuring the saturation and frequency content of the digital signal. In a serial processing system, digital control circuitry 307 will only contain monitor 309, which will implement these measurements serially. In a parallel processing system, digital control circuitry 307 will contain monitors 309, 310, and 311, which will implement these measurements in parallel. While the serial processing system will take longer to process the three measurements, the parallel processing system requires more hardware to implement.

Once digital control circuitry 307 has measured the frequency content and saturation, it determines the optimal equalization settings which are passed to analog equalization circuitry 305. In some implementations, they may also be stored in memory 303 for use while processing data traffic when link training is complete.

Figure 4:
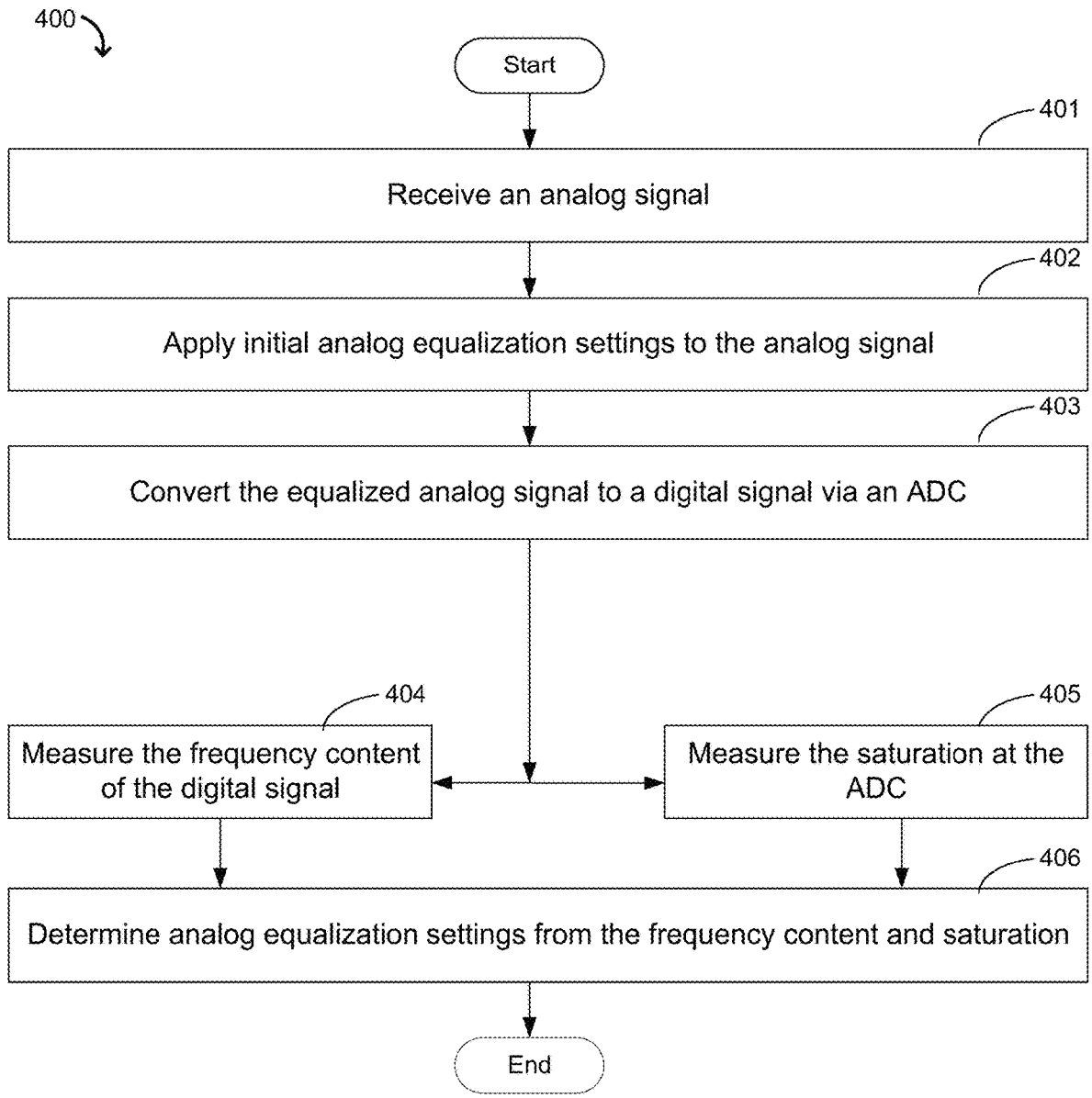
FIG. 4 is a flow diagram illustrating a method for determining equalization settings for link training in an ADC-based SerDes system according to implementations of the subject matter of this disclosure.

FIG. 4 is a flow diagram illustrating method 400 for determining equalization settings for link training in an ADC-based SerDes system according to implementations of the subject matter of this disclosure.

At 401, an analog signal is received. At 402, the receives applies initial analog equalization settings to the analog signal. The equalized analog signal is then converted into a digital signal by an ADC at 403.

The receiver then measures the frequency content and the saturation at the ADC of the digital signal at 404 and 405 respectively. At 405, the frequency content and saturation measurements are used to determine analog equalization settings.

As used herein and in the claims which follow, the construction "one of A and B" shall mean "A or B."

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A method for tuning analog equalization settings for link training at an analog-to-digital converter-based serial receiver, the method comprising:
   receiving, at the receiver, a first analog signal from a transmitter;
   applying initial analog equalization settings to the first analog signal to generate a first equalized analog signal;
   converting, at the receiver, the first equalized analog signal to a first digital signal using an analog-to-digital converter;
   measuring a first frequency content of the digital signal;
   measuring a first saturation at the analog-to-digital converter; and
   determining updated analog equalization settings from the first frequency content of the digital signal and the first saturation.

2. The method of claim 1, wherein measuring the first frequency content of the first digital signal comprises:
   applying digital equalization settings with high-pass filter coefficients to the first digital signal to generate a high-pass-filtered digital signal;
   measuring an average power of the high-pass filtered digital signal;
   applying digital equalization settings with low-pass filter coefficients to the first digital signal to generate a low-pass-filtered digital signal; and
   measuring an average power of the low-pass filtered digital signal.

3. The method of claim 1, wherein measuring the first saturation comprises calculating a percentage of amplitudes of the first analog signal which are outside a threshold range of the analog-to-digital converter.

4. The method of claim 2, wherein measuring an average power of the high-pass filtered digital signal, measuring an average power of the low-pass filtered digital signal, and measuring the first saturation are performed sequentially at a monitor.

5. The method of claim 2, wherein measuring an average power of the high-pass filtered digital signal is performed at a first monitor, measuring an average power of the low-pass filtered digital signal is performed at a second monitor, and measuring the first saturation is performed at a third monitor, wherein the measuring of an average power of the high-pass filtered digital signal, the measuring of an average power of the low-pass filtered digital signal, and the measuring the first saturation are performed in parallel.

6. The method of claim 1 further comprising:
   receiving, at the receiver, a second analog signal from the transmitter;
   applying the updated analog equalization settings to the second analog signal;

converting, at the receiver, the equalized second analog signal to a second digital signal using the analog-to-digital converter;

measuring a second frequency content of the second digital signal by applying a high-pass filter and a low-pass filter;

measuring a second saturation of the analog-to-digital converter; and determining second updated analog equalization settings from the second frequency content of the digital signal and the second saturation.

7. The method of claim 1 further comprising:

in response to determining the updated analog equalization settings, incrementing an update counter;

comparing the update counter to an update threshold; and in response to determining that the update counter has exceeded the update threshold, storing the updated analog equalization settings.

8. The method of claim 1 wherein determining updated analog equalization settings comprises applying a least mean squares function.

9. An analog-to-digital converter-based serial receiver comprising:

input/output circuitry configured to receive a first analog signal from a transmitter;

equalization circuitry configured to apply initial analog equalization settings to the first analog signal to generate a first equalized analog signal;

an analog-to-digital converter configured to convert the first equalized analog signal to a first digital signal; and digital control circuitry configured to:
 measure a first frequency content of the first digital signal,
 measure a first saturation at the analog-to-digital converter, and
 determine updated analog equalization settings from the first frequency content of the first digital signal and the first saturation.

10. The receiver of claim 9, wherein the digital control circuitry comprises digital equalization circuitry configured to:

generate a high-pass-filtered digital signal by applying digital equalization settings with high-pass filter coefficients to the first digital signal; and generate a low-pass-filtered digital signal by applying digital equalization settings with low-pass filter coefficients to the first digital signal.

11. The receiver of claim 10, wherein the digital control circuitry further comprises a monitor configured to:

measure the average power of the high-pass-filtered digital signal; and measure the average power of the low-pass-filtered digital signal.

12. The receiver of claim 11 wherein the monitor is further configured to measure the first saturation.

13. The receiver of claim 10 wherein the digital control circuitry further comprises:

a first monitor configured to measure the average power of the high-pass-filtered digital signal; and a second monitor configured to measure the average power of the low-pass-filtered digital signal.

14. The receiver of claim 13 wherein the digital control circuitry further comprises a third monitor configured to measure the first saturation.

15. The receiver of claim 9 wherein the digital control circuitry comprises a monitor configured to measure the first saturation by calculating a percentage of amplitudes of the first analog signal which are outside a threshold range of the analog-to-digital converter.

16. The receiver of claim 9, wherein:

the input/output circuitry is further configured to receive a second analog signal from a transmitter;

the equalization circuitry is further configured to apply the updated analog equalization settings to the second analog signal;

the analog-to-digital converter is further configured to convert the second equalized analog signal to a second digital signal; and the digital control circuitry is further configured to:
 measure a second frequency content of the second digital signal;
 measure a second saturation at the analog-to-digital converter; and
 determine second updated analog equalization settings from the frequency content of the second digital signal and the second saturation.

17. The receiver of claim 9 further comprising:

a memory; wherein:

the digital control circuitry is further configured to:

in response to determining the updated analog equalization settings, increment an update counter;

compare the update counter to an update threshold; and in response to determining that the update counter has exceeded the update threshold, store the updated analog equalization settings in the memory.

18. The receiver of claim 9 wherein the equalization circuitry is adapted by a least mean squares function.

* * * * *